United States Patent
Yanagihara

(10) Patent No.: US 10,594,273 B2
(45) Date of Patent: *Mar. 17, 2020

(54) POWER AMPLIFIER MODULE

(71) Applicant: Murata Manufacturing Co., Ltd., Kyoto (JP)

(72) Inventor: Shingo Yanagihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,028

(22) Filed: Aug. 23, 2018

(65) Prior Publication Data
US 2018/0367105 A1 Dec. 20, 2018

Related U.S. Application Data

(63) Continuation of application No. 15/641,631, filed on Jul. 5, 2017, now Pat. No. 10,084,418.

(30) Foreign Application Priority Data

Jul. 27, 2016 (JP) .................... 2016-147664

(51) Int. Cl.
*H03F 1/56* (2006.01)
*H03F 3/24* (2006.01)
(Continued)

(52) U.S. Cl.
CPC .......... *H03F 1/565* (2013.01); *H03F 3/195* (2013.01); *H03F 3/213* (2013.01); *H03F 3/245* (2013.01);
(Continued)

(58) Field of Classification Search
USPC .......... 330/124 R, 295, 84, 286, 53–54, 302, 330/310, 98, 133, 150
See application file for complete search history.

(56) References Cited

U.S. PATENT DOCUMENTS

| | | | |
|---|---|---|---|
| 7,733,187 B2 * | 6/2010 | Tateoka | H03F 1/56 330/302 |
| 8,466,745 B2 | 6/2013 | Guo | |
| 8,536,950 B2 * | 9/2013 | Nejati | H03F 1/565 330/302 |

FOREIGN PATENT DOCUMENTS

JP 2006-180151 A 7/2006

OTHER PUBLICATIONS

T. Shimura et al., "A Multiband Power Amplifier Using Combination of CMOS and GaAs Technologies for WCDMA Handsets", IEEE Radio Frequency Integrated Circuits Symposium, 2014, pp. 141-144, Mitsubishi Electric Corporation, Itami, 664-8641, Japan.

* cited by examiner

*Primary Examiner* — Hieu P Nguyen
(74) *Attorney, Agent, or Firm* — Pearne & Gordon LLP

(57) ABSTRACT

A power amplifier module includes a first amplifier that amplifies an input signal to generate a first amplified signal and outputs the first amplified signal, a second amplifier that amplifies the first amplified signal to generate a second amplified signal and outputs the second amplified signal, and a matching network disposed between an output terminal of the first amplifier and an input terminal of the second amplifier. The first amplifier is provided on a first chip, and the second amplifier is provided on a second chip. The matching network has an impedance transformation characteristic adjustable in accordance with a control signal.

20 Claims, 4 Drawing Sheets

(51) Int. Cl.
*H03F 3/195* (2006.01)
*H03F 3/213* (2006.01)
(52) U.S. Cl.
CPC .. *H03F 2200/222* (2013.01); *H03F 2200/318* (2013.01); *H03F 2200/387* (2013.01); *H03F 2200/411* (2013.01); *H03F 2200/451* (2013.01)

POWER AMPLIFIER MODULE

This is a continuation of U.S. patent application Ser. No. 15/641,631 filed on Jul. 5, 2017 which claims priority from Japanese Patent Application No. 2016-147664 filed on Jul. 27, 2016. The contents of these applications are incorporated herein by reference in their entireties.

BACKGROUND

The present disclosure relates to a power amplifier module. A mobile terminal that uses a communication network for cellular phones includes a power amplifier module having multiple stages of amplifiers for amplifying power of a radio frequency (RF) signal to be transmitted to a base station. For example, Japanese Unexamined Patent Application Publication No. 2006-180151 discloses a power amplifier module in which a comparatively low cost laterally diffused metal-oxide-semiconductor field-effect transistor (LDMOSFET) is used for a drive stage and a comparatively high efficiency heterojunction bipolar transistor (HBT) is used for a power stage.

In a power amplifier module, typically, a matching network is disposed between an output terminal of the drive stage and an input terminal of the power stage for matching the output impedance of the drive stage and the input impedance of the power stage. Impedance matching between different semiconductor chips may not result in the realization of the desired impedance due to a change in the ground condition of each semiconductor chip, depending on the arrangement positions of the semiconductor chips, and so on, which hinders high-accuracy impedance matching. Due to this problem, the module disclosed in Japanese Unexamined Patent Application Publication No. 2006-180151 has a problem in that the absence of high-accuracy impedance matching between stages of amplifiers results in an increase in the transmission loss of an RF signal.

BRIEF SUMMARY

Accordingly, the present disclosure provides a power amplifier module that achieves high-accuracy impedance matching while keeping costs low.

According to preferred embodiments of the present disclosure, a power amplifier module includes a first amplifier that amplifies an input signal to generate a first amplified signal and outputs the first amplified signal, a second amplifier that amplifies the first amplified signal to generate a second amplified signal and outputs the second amplified signal, and a matching network disposed between an output terminal of the first amplifier and an input terminal of the second amplifier. The first amplifier is provided on a first chip, and the second amplifier is provided on a second chip. The matching network has an impedance transformation characteristic adjustable in accordance with a control signal.

According to preferred embodiments of the present disclosure, a power amplifier module that achieves high-accuracy impedance matching while keeping costs low can be provided.

Other features, elements, characteristics and advantages of the present disclosure will become more apparent from the following detailed description of preferred embodiments of the present disclosure with reference to the attached drawings.

DETAILED DESCRIPTION

Embodiments of the present disclosure will be described in detail hereinafter with reference to the drawings. The same or substantially the same elements are assigned the same numerals or symbols and are not described redundantly herein.

Figure 1:
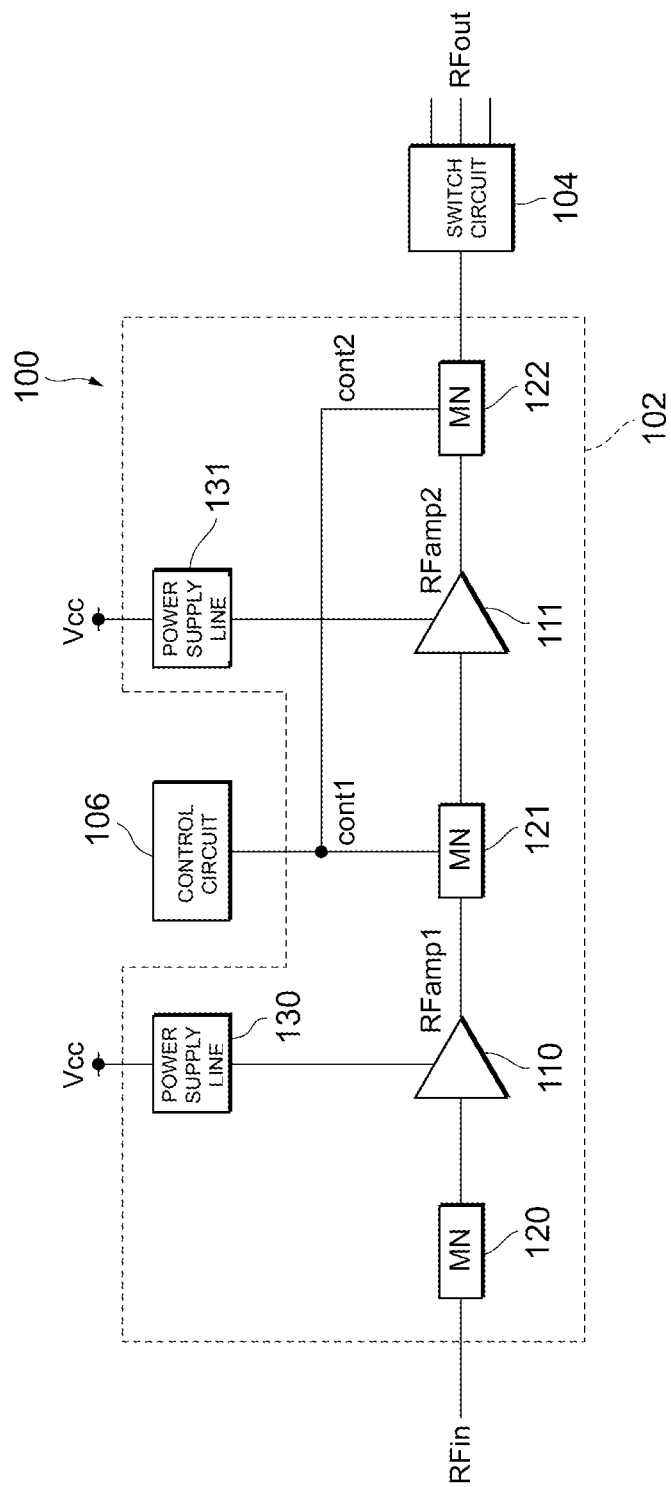
FIG. 1 illustrates a configuration of a power amplifier module according to an embodiment of the present disclosure.

FIG. 1 illustrates a configuration of a power amplifier module 100 according to an embodiment of the present disclosure. The power amplifier module 100 is included in, for example, a mobile communication device such as a cellular phone, and is configured to amplify a radio frequency (RF) signal that is an input signal and to output the amplified signal. The input signal has a frequency of the order of several gigahertz (GHz), for example.

As illustrated in FIG. 1, the power amplifier module 100 includes, for example, a power amplification circuit 102, a switch circuit 104, and a control circuit 106. The power amplification circuit 102 includes amplifiers 110 and 111, matching networks (MN) 120, 121, and 122, and power supply lines 130 and 131. The configuration of the power amplifier module 100 is not limited to that illustrated in FIG. 1, and the power amplifier module 100 may have any other configuration.

The amplifiers 110 and 111 form two stages of amplifiers. The amplifier 110 (first amplifier) amplifies an input signal RFin and outputs an amplified signal RFamp1 (first amplified signal). The amplified signal RFamp1 is supplied to the amplifier 111 via the matching network 121. The amplifier 111 (second amplifier) amplifies the amplified signal RFamp1 and outputs an amplified signal RFamp2 (second amplified signal). The amplifiers 110 and 111 are supplied with a predetermined power supply voltage Vcc via the power supply lines 130 and 131, respectively. The amplifiers 110 and 111 are also supplied with a bias current or bias voltage from a bias circuit (not illustrated). The number of stages of amplifiers is not limited to two and three or more stages of amplifiers may be formed.

The matching networks 120, 121, and 122 are disposed prior to the amplifier 110 and prior to and subsequent to the amplifier 111, respectively, and are each configured to match impedance between circuits.

The power supply lines 130 and 131 are disposed between a power supply circuit (not illustrated) and the amplifier 110 and between the power supply circuit and the amplifier 111, respectively, and are each configured to suppress leakage of an RF signal into the power supply circuit.

The amplified signal RFamp2 output from the amplifier 111 is supplied to the switch circuit 104 via the matching network 122. The switch circuit 104 outputs an output signal RFout from any one of a plurality of output terminals thereof in accordance with the frequency band of the RF signal. The output signal RFout output from the switch circuit 104 is transmitted to a base station via an antenna (not illustrated).

The control circuit 106 supplies control signals cont1 and cont2 corresponding to the frequency band of the input signal RFin to the matching networks 121 and 122, respectively. The control signals cont1 and cont2 are signals for controlling the impedance transformation characteristics of the matching networks 121 and 122, respectively. The adjustment of the impedance transformation characteristics for the matching networks 121 and 122 will be described below.

Figure 2:
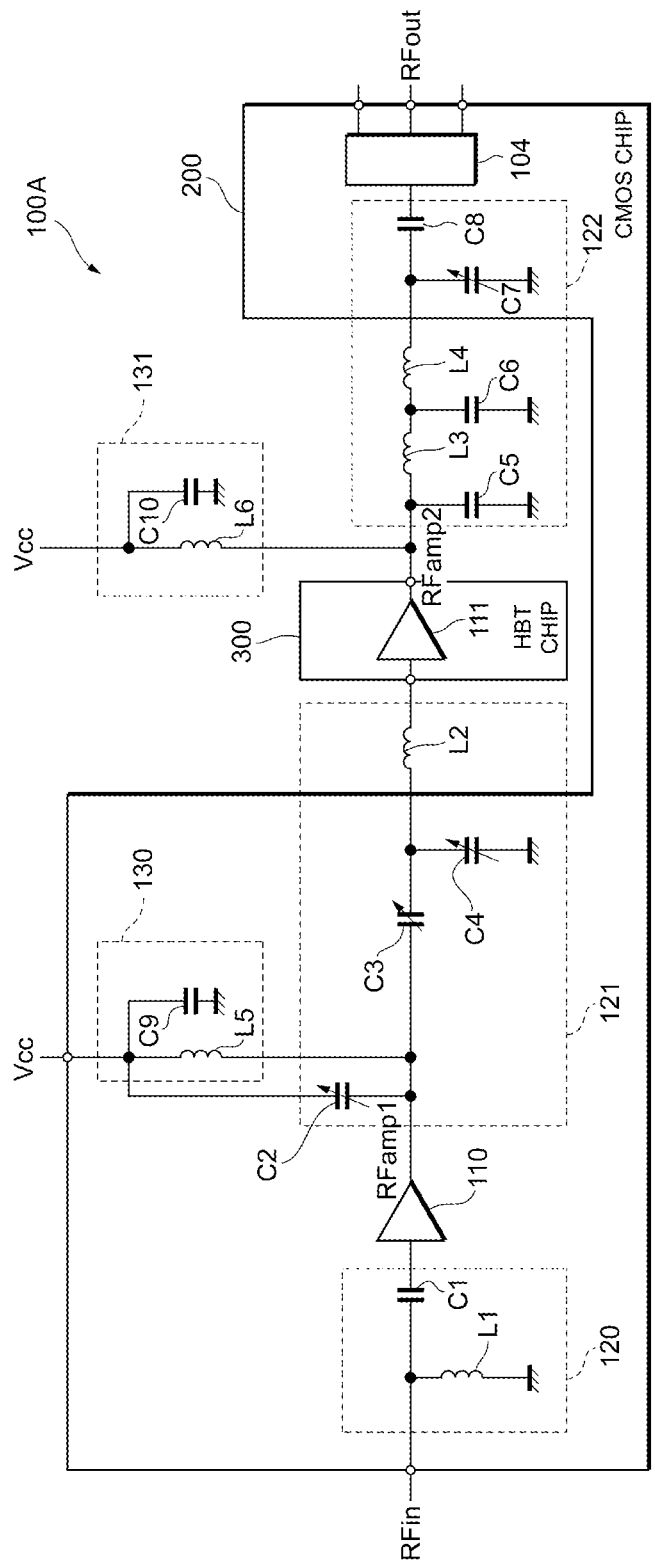
FIG. 2 illustrates an example configuration of a power amplifier module according to an embodiment of the present disclosure.

FIG. 2 illustrates an example configuration of the power amplifier module 100 (a power amplifier module 100A) according to an embodiment of the present disclosure. The power amplifier module 100A includes a complementary metal-oxide semiconductor (CMOS) chip 200 and an HBT chip 300. In the power amplifier module 100A illustrated in FIG. 2, the control circuit 106 illustrated in FIG. 1 is not illustrated.

The CMOS chip 200 (first chip) is a chip having integrated thereon elements including a field-effect transistor (a metal-oxide-semiconductor field-effect transistor (MOSFET)). The MOSFET on the CMOS chip 200 constitutes the amplifier 110 in a drive stage. CMOS chips are less expensive and have higher noise performance than HBT chips.

The HBT chip 300 (second chip) is a chip having integrated thereon elements including an HBT. The HBT on the HBT chip 300 constitutes the amplifier 111 in a power stage. Since HBT chips are capable of withstanding higher voltages than CMOS chips, it is preferable to use an HBT chip for the power stage with higher output power than the drive stage. In this manner, the amplifiers 110 and 111 in the two stages are formed on semiconductor chips constructed by using different processes. Thus, a power amplifier module having excellent noise performance and voltage-withstand capability with reduced manufacturing cost can be provided.

The CMOS chip 200 and the HBT chip 300 preferably have a bump structure. The bump structure allows connection between bumps by using an inductor formed as a pattern on a substrate. Different from a wire bonding structure, the bump structure does not cause coupling between wires, resulting in it being likely to ensure characteristics. In addition, no wire sweep occurs when a chip is molded (sealed), resulting in reduced variations and improved quality.

The matching network 120 includes a capacitor C1 and an inductor L1. The capacitor C1 has a first end supplied with the input signal RFin, and a second end connected to an input terminal of the amplifier 110. The inductor L1 has a first end connected to the first end of the capacitor C1, and a second end grounded. For example, the matching network 120 is disposed prior to the amplifier 110 on the CMOS chip 200 to remove the direct-current components from the input signal RFin.

The matching network 121 includes capacitors C2, C3, and C4 and an inductor L2. The capacitor C2 has a first end supplied with the power supply voltage Vcc, and a second end connected to an output terminal of the amplifier 110. The capacitor C3 has a first end connected to the output terminal of the amplifier 110, and a second end connected to a first end of the inductor L2. The capacitor C4 has a first end connected to the second end of the capacitor C3, and a second end grounded. The inductor L2 has a first end connected to the second end of the capacitor C3, and a second end connected to an input terminal of the amplifier 111. The matching network 121 is disposed between the amplifier 110 (drive stage) and the amplifier 111 (power stage) and is configured to match the output impedance of the amplifier 110 and the input impedance of the amplifier 111. All of the constituent elements of the matching network 121 may be provided on the CMOS chip 200, or some constituent elements (for example, the capacitors C2, C3, and C4) may be provided on the CMOS chip 200 and the remaining constituent element or elements (for example, the inductor L2) may be provided outside the CMOS chip 200. In this case, the element or elements not provided on the CMOS chip 200 may be provided directly on a substrate. The inductor L2 may be formed as a pattern on the substrate or as a surface mount device (SMD), for example.

The matching network 122 (an output matching network) includes capacitors C5, C6, C7, and C8 and inductors L3 and L4. The capacitor C5 has a first end connected to an output terminal of the amplifier 111, and a second end grounded. The capacitor C6 has a first end connected to a second end of the inductor L3, and a second end grounded. The capacitor C7 has a first end connected to a second end of the inductor L4, and a second end grounded. The capacitor C8 has a first end connected to the second end of the inductor L4, and a second end connected to an input terminal of the switch circuit 104. The inductor L3 has a first end connected to the first end of the capacitor C5, and a second end connected to the first end of the capacitor C6. The inductor L4 has a first end connected to the first end of the capacitor C6, and a second end connected to the first end of the capacitor C7. The matching network 122 is disposed between the output terminal of the amplifier 111 and the input terminal of the switch circuit 104 (i.e., the circuit subsequent to the amplifier 111) and is configured to match the output impedance of the amplifier 111 and the input impedance of the switch circuit 104. All of the constituent elements of the matching network 122 may be provided on the CMOS chip 200, or some constituent elements (for example, the capacitors C7 and C8) may be provided on the CMOS chip 200 and the remaining constituent element or elements (for example, the capacitors C5 and C6 and the inductors L3 and L4) may be provided outside the CMOS chip 200.

The power supply line 130 includes an inductor L5 and a capacitor C9, and the power supply line 131 includes an inductor L6 and a capacitor C10. The inductors L5 and L6 have first ends to which the power supply voltage Vcc is applied, and second ends from which power supply is provided to the amplifiers 110 and 111, respectively. The capacitors C9 and C10 have first ends connected to the first ends of the inductors L5 and L6, respectively, and second ends grounded. In this embodiment, the power supply line 130 and the switch circuit 104 are provided on the CMOS chip 200, and the power supply line 131 is provided outside the CMOS chip 200.

A description will now be given of the function of adjusting the impedance transformation characteristics for the matching networks 121 and 122. A power amplification circuit having multiple stages of amplifiers typically needs impedance matching between amplifiers since the output impedance (for example, approximately 20 to 30Ω) of the amplifier 110 and the input impedance (for example, approximately 3Ω) of the amplifier 111 are not equal. In a configuration in which a drive-stage amplifier and a power-stage amplifier are provided on different chips, it is difficult to match the impedances of both amplifiers, compared with a configuration in which both amplifiers are provided on the same chip. The reason for this is that a configuration in which both amplifiers are provided on different chips makes variations in constituent elements (such as capacitors or inductors) on the respective chips less uniform than the configuration in which both amplifiers are provided on the same chip. Another reason is that the use of a plurality of chips may cause variations in mounting when a module is assembled.

This embodiment enables adjustment of the impedance transformation characteristics of the matching networks 121 and 122 in accordance with the control signals cont1 and cont2 output from the control circuit 106, respectively. Specifically, for example, the capacitors C2, C3, and C4 in the matching network 121 are assumed to be capacitors whose capacitances are adjustable (first variable capacitor) (a capacitor whose capacitance is adjustable is hereinafter also referred to as a "variable capacitor"). Accordingly, the capacitances of the capacitors C2, C3, and C4 are controlled in accordance with the control signal cont1, and the impedance transformation characteristics of the matching network 121 are adjusted. Thus, high-accuracy matching is achievable between the output impedance of the amplifier 110 provided on the CMOS chip 200 and the input impedance of the amplifier 111 provided on the HBT chip 300. In the matching network 122, likewise, for example, the capacitor C7 is assumed to be a variable capacitor (second variable capacitor). Accordingly, the capacitance of the capacitor C7 is controlled in accordance with the control signal cont2, and the impedance transformation characteristics of the matching network 122 are adjusted. Thus, high-accuracy matching is achievable between the output impedance of the amplifier 111 provided on the HBT chip 300 and the input impedance of a circuit subsequent to the amplifier 111 and provided on the CMOS chip 200 (for example, the switch circuit 104).

Figure 3:
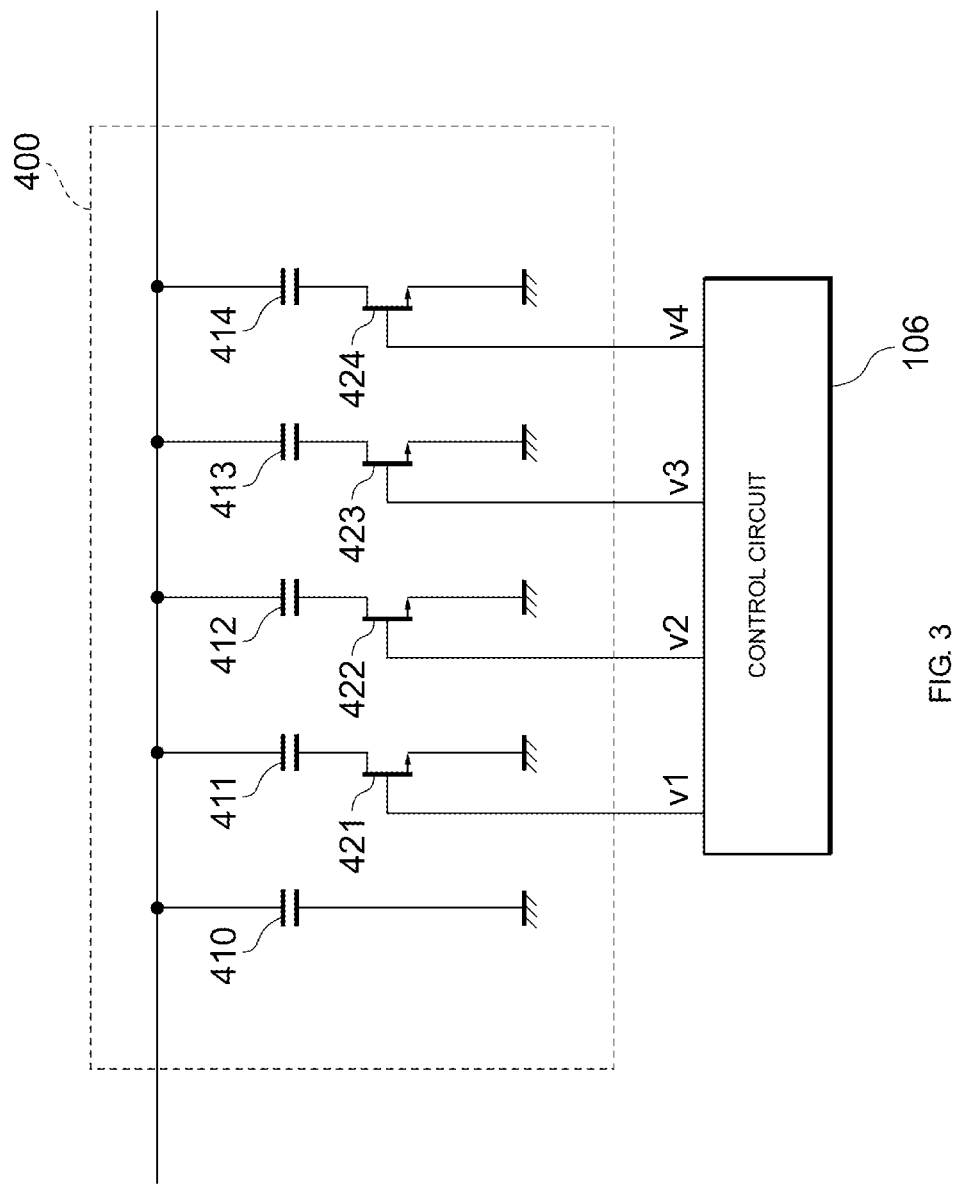
FIG. 3 illustrates an example configuration of a variable capacitor.

FIG. 3 illustrates an example configuration of a variable capacitor. A variable capacitor 400 illustrated in FIG. 3 has an example configuration applicable to a capacitor shunt-connected to a signal path, such as the capacitor C4 or C7 illustrated in FIG. 2. The variable capacitor 400 includes, for example, capacitors 410, 411, 412, 413, and 414 and MOSFETs 421, 422, 423, and 424.

The capacitors 410 (first capacitor), 411 (second capacitor), 412, 413, and 414 have first ends connected to one another. The capacitor 410 has a second end grounded. The capacitors 411 to 414 are connected in series with the MOSFETs 421 to 424, respectively. The MOSFETs 421 to 424 have drains connected to second ends of the capacitors 411 to 414, respectively, gates respectively supplied with control voltages v1 to v4 (control signals) from the control circuit 106, respectively, and sources grounded.

The capacitors 410 to 414 may be capacitors having different capacitances, for example. The MOSFETs 421 to 424 have a function as switches whose on and off states are switched in accordance with the control voltages v1 to v4 supplied from the control circuit 106, respectively. Specifically, for example, when the control voltage v1 is a comparatively high voltage, the MOSFET 421 (switch) is turned on and electric charge is accumulated in the capacitor 411. When the control voltage v1 is a comparatively low voltage, the MOSFET 421 (switch) is turned off and no electric charge is accumulated in the capacitor 411. In this way, the combination of the on or off states of the MOSFETs 421 to 424 is controlled by using the control voltages v1 to v4 to achieve the adjustment of the combined capacitance of the capacitors 410 to 414.

In this embodiment, four capacitors are controlled by the control circuit 106, and 16-level adjustment is achieved, by way of example. However, the number of capacitors to be controlled is not limited to this number. One, two, or three capacitors may be controlled, or five or more capacitors may be used. In FIG. 3, furthermore, the switches are each formed by an N-channel MOSFET, by way of example. However, the configuration of the switches is not limited to that illustrated in FIG. 3, and each of the switches may be a P-channel MOSFET or any other element having a switching function.

With the configuration described above, in the power amplifier module 100A, the impedance transformation characteristics for the matching networks 121 and 122 are dynamically adjusted in accordance with the frequency band of the input signal RFin. This makes impedance matching feasible with high accuracy even between different semiconductor chips while reducing cost.

Noise characteristics are determined in accordance with the performance of the drive stage. In this embodiment, the drive stage is constituted by a MOSFET having better noise performance than an HBT. This configuration improves the noise performance, compared with a power amplification circuit in which the drive stage is constituted by an HBT.

In FIG. 2, all of the capacitors C2, C3, and C4 included in the matching network 121 are variable capacitors, by way of example. However, capacitors implemented as variable capacitors are not limited to the capacitors C2, C3, and C4. For example, any one or two of the capacitors (for example, the capacitors C3 and C4) may be variable capacitors and the remaining capacitor or capacitors (for example, the capacitor C2) may have a fixed capacitance. Alternatively, the inductor L5 in the power supply line 130 may be a variable inductor. In terms of design flexibility, three or more elements out of the four elements, namely, the capacitors C2, C3, and C4 and the inductor L5, are preferably variable, and more preferably all of the four elements are variable.

In FIG. 2, furthermore, the capacitor C7, which is closer to the switch circuit 104 among the plurality of capacitors included in the matching network 122, is a variable capacitor, by way of example. However, a capacitor implemented as a variable capacitor is not limited to the capacitor C7, and any other capacitor (for example, the capacitor C5, C6, or the like) may be variable. It is preferable that a capacitor close to the switch circuit 104 be variable for the following two reasons. First, since an element of the matching network 122 closer to the switch circuit 104 has a higher output impedance (for example, the switch circuit 104 has an output impedance of approximately 50Ω), the use of a variable capacitor as a capacitor closer to the switch circuit 104 enables more reduction in the effect of the variable capacitor on resistance. Second, if a circuit or the like is connected to the tip of an output terminal of the matching network 122, the use of a variable capacitor as a capacitor closer to the switch circuit 104 facilitates adjustment.

In addition, the configuration of the matching networks 121 and 122 is not limited to that illustrated in FIG. 2. When each of the matching networks 121 and 122 includes an inductor, the inductors may be formed of variable inductors whose inductances are adjustable (first variable inductor and second variable inductor) to adjust the impedance transformation characteristics of the matching networks 121 and 122.

Figure 4:
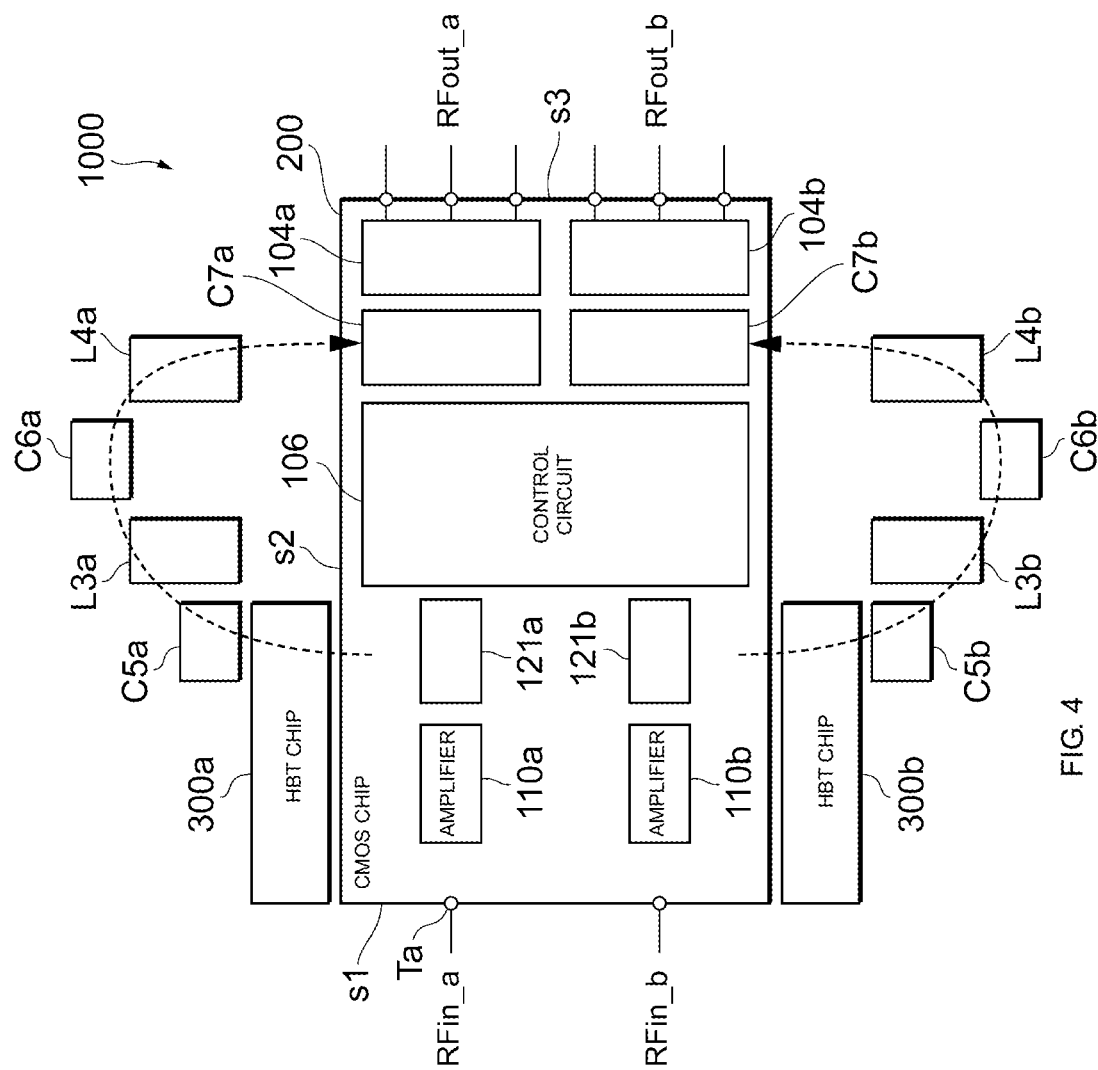
FIG. 4 schematically illustrates an example chip arrangement in a power amplifier module according to an embodiment of the present disclosure.

FIG. 4 schematically illustrates an example chip arrangement in a power amplifier module 1000 according to an embodiment of the present disclosure. For convenience of illustration, elements of the power amplifier module 1000 corresponding to the elements illustrated in FIG. 1 or 2 are assigned numerals similar to those in FIG. 1 or 2. For convenience of illustration, furthermore, only the following elements among the elements included in the power amplifier module 1000 are illustrated in FIG. 4, and the remaining elements are not illustrated in FIG. 4.

The power amplifier module 1000 includes power amplification circuits that support two input signals RFin_a and RFin_b conforming to different communication standards (modes) or having different frequency ranges (bands). Each of the power amplification circuits has the configuration illustrated in FIG. 1. Specifically, the power amplifier module 1000 includes an amplification path for amplifying the input signal RFin_a and outputting an output signal RFout_a, and an amplification path for amplifying the input signal RFin_b and outputting an output signal RFout_b. These two amplification paths have similar configurations and, in the following description, the configuration of the path for the input signal RFin_a is taken as an example. Note that the power amplifier module 1000 may not necessarily include two amplification paths, and may include one or more than two amplification paths.

The power amplifier module 1000 includes a CMOS chip 200 (first chip) and an HBT chip 300a (second chip), each having substantially a rectangular shape. An input terminal Ta to which the input signal RFin_a is supplied is arranged on a side s1 (first side) of the CMOS chip 200. An amplifier 110a (first amplifier) is arranged on the CMOS chip 200 near the side s1. A matching network 121a is arranged in an area adjacent to the amplifier 110a. That is, a variable capacitor included in the matching network 121a (for example, the capacitors C2, C3, and C4 illustrated in FIG. 2) is provided in this area.

The HBT chip 300a (second chip) is arranged in a neighboring area of the CMOS chip 200 near a side s2 (second side) of the CMOS chip 200, which is perpendicular to the side s1.

The elements included in a matching network 122a (namely, a capacitor C5a, an inductor L3a, a capacitor C6a, and an inductor L4a) are arranged within a neighboring area of the CMOS chip 200 in order from the one nearest to the HBT chip 300a.

A capacitor C7a included in the matching network 122a is arranged in a portion of the CMOS chip 200 near a side s3 (third side) of the CMOS chip 200 opposite the side s1. A switch circuit 104a is arranged in an area adjacent to the matching network 122a on the CMOS chip 200 at a position near the side s3.

The control circuit 106 is arranged substantially in a center portion of the CMOS chip 200. Specifically, the control circuit 106 is arranged between the matching network 121a and the capacitor C7a (i.e., between the amplifier 110a and the switch circuit 104a).

With the arrangement described above, in the power amplifier module 1000, the input signal RFin_a is input to the CMOS chip 200 through the side s1, and is amplified by the amplifier 110a (first amplifier). The amplified signal (first amplified signal) from the amplifier 110a is input from the CMOS chip 200 to the HBT chip 300a through the side s2, and is amplified by an HBT (second amplifier). The amplified signal (second amplified signal) from the HBT chip 300a is supplied again to the CMOS chip 200 through the side s2, and is output from the switch circuit 104a through the side s3.

In this embodiment, the elements included in the matching network 122a, namely, the capacitor C5a, the inductor L3a, the capacitor C6a, and the inductor L4a, are arranged to be spaced a predetermined distance (for example, approximately 300 µm) away from the control circuit 106 included in the CMOS chip 200. This arrangement allows the amplified signal to be transmitted along a path (for example, substantially U-shaped path) that bypasses the control circuit 106 (see a broken-line arrow in FIG. 4). This can reduce the effect of noise output from the control circuit 106 on an RF signal.

The amplifier 110a is arranged on a side of the CMOS chip 200 opposite the switch circuit 104a with the control circuit 106 interposed therebetween (i.e., the amplifier 110a is arranged to be near the side s1). An amplifier 111a is also arranged to be spaced a predetermined distance (for example, approximately 300 µm) away from the switch circuit 104a. This arrangement can ensure isolation between the amplifiers 110a and 111a and the output signal RFout_a and reduce the effect of noise on the amplification of an RF signal.

An exemplary embodiment of the present disclosure has been described. The power amplifier modules 100, 100A, and 1000 include the amplifier 110 disposed on the CMOS chip 200, the amplifier 111 disposed on the HBT chip 300, and the matching network 121 between the amplifiers 110 and 111, the matching network 121 having an impedance transformation characteristic adjustable in accordance with a control signal. Thus, a power amplifier module that achieves high-accuracy impedance matching even between different semiconductor chips while reducing cost can be provided.

In the power amplifier modules 100, 100A, and 1000, the amplifier 110 in the drive stage is constituted by a MOSFET and the amplifier 111 in the power stage is constituted by an HBT. Thus, a power amplifier module having excellent noise performance and voltage-withstand capability with reduced manufacturing cost can be provided.

The power amplifier modules 100, 100A, and 1000 further include the control circuit 106 that outputs the control signals cont1 and cont2 in accordance with the frequency band of the input signal RFin to adjust the impedance transformation characteristics of the matching networks 121 and 122. This allows the impedance transformation characteristics of the matching networks 121 and 122 to be dynamically adjusted in accordance with the frequency band of the input signal RFin.

While the configuration of the matching networks 121 and 122 is not limited to any specific one, the matching networks 121 and 122 may each include a variable capacitor or a variable inductor, for example.

In addition, as illustrated in FIG. 2, the variable capacitors or variable inductors included in the matching networks 121 and 122 may be provided on the CMOS chip 200. The configuration of the variable capacitors or variable inductors is not limited to this.

In addition, each of the variable capacitors included in the matching networks 121 and 122 may include the capacitors 410 to 414, which are connected in parallel, and the MOSFETs 421 to 424 (switches), which are connected in series with the capacitors 411 to 414, respectively, and may be configured such that the capacitance of the variable capacitor is adjusted by switching between the on and off states of the MOSFETs 421 to 424. The configuration of the variable capacitors is not limited to this.

The power amplifier modules 100, 100A, and 1000 further include, between the output terminal of the amplifier 111 and the input terminal of the subsequent switch circuit 104, the matching network 122 having an impedance transformation characteristic adjustable in accordance with the control signal cont2. This configuration allows high-accuracy matching between the output impedance of the amplifier 111 and the input impedance of the subsequent circuit.

The power amplifier module 1000 further includes the switch circuit 104a, which is provided on the CMOS chip 200, and the control circuit 106 is arranged on the CMOS chip 200 between the amplifier 110a and the switch circuit 104a. This arrangement ensures isolation between the amplifiers 110a and 111a and the output signal RFout, and reduces the effect of noise on the amplification of an RF signal.

In the power amplifier module 1000, furthermore, the input terminal Ta for the input signal RFin is arranged on the side s1 of the CMOS chip 200, the HBT chip 300a is arranged near the side s2 perpendicular to the side s1 of the CMOS chip 200, and the switch circuit 104a is arranged near the side s3 opposite the side s1 of the CMOS chip 200. This configuration allows an amplified signal to be transmitted along a path that bypasses the control circuit 106, as illustrated in FIG. 4. This can reduce the effect of noise output from the control circuit 106 on an RF signal.

The embodiments described above are intended for easy understanding of the present invention, and it is not intended to construe the present invention in a limiting fashion. Various modifications and improvements can be made to the present invention without departing from the gist of the present invention, and equivalents thereof are also included in the present invention. That is, the embodiments may be appropriately modified in design by those skilled in the art, and such modifications also fall within the scope of the present invention so long as the modifications include the features of the present invention. For example, the elements included in the embodiments and the arrangement, materials, conditions, shapes, sizes, and the like thereof are not limited to those described in the illustrated examples but can be modified as appropriate. In addition, the elements included in the embodiments can be combined as much as technically possible, and such combinations of elements also fall within the scope of the present invention so long as the combinations of elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
   a first amplifier that amplifies an input signal and outputs a first amplified signal;
   a second amplifier that amplifies the first amplified signal and outputs a second amplified signal;
   a matching network disposed between an output terminal of the first amplifier and an input terminal of the second amplifier, the matching network having an adjustable impedance transformation characteristic; and
   a switch circuit that is supplied with the second amplified signal and outputs the second amplified signal from one of a plurality of output terminals, wherein:
   the first amplifier and the switch circuit are provided on a first chip,
   the second amplifier is provided on a second chip,
   an input terminal for the input signal is arranged on a first side of the first chip,
   the second chip is arranged adjacent to a second side of the first chip, the second side being perpendicular to the first side,
   the switch circuit is arranged closer to a third side of the first chip than the first side of the first chip, the third side opposing the first side,
   the first amplified signal from the first amplifier is input to the second amplifier through the second side,
   the second amplified signal from the second amplifier is input to the switch circuit through the second side, and
   the second amplified signal from the switch circuit is output through the third side.

2. The power amplifier module according to claim 1, wherein:
   the first chip is a complementary metal-oxide semiconductor chip having a metal-oxide-semiconductor field-effect transistor, and
   the second chip is a bipolar transistor chip having a bipolar transistor.

3. The power amplifier module according to claim 1, wherein:
   the matching network comprises a first variable capacitor or a first variable inductor, and
   a capacitance of the first variable capacitor or an inductance of the first variable inductor is adjustable.

4. The power amplifier module according to claim 3, wherein the first variable capacitor or the first variable inductor is provided on the first chip.

5. The power amplifier module according to claim 3, wherein:
   the first variable capacitor comprises:
     a first capacitor,
     a second capacitor, the first capacitor and the second capacitor being connected in parallel, and
     a switch connected in series with the second capacitor, and
   wherein the switch is configured to be turned-on and turned-off, thereby connecting the second capacitor to ground when the switch is turned-on and thereby adjusting the capacitance of the first variable capacitor.

6. The power amplifier module according to claim 4, wherein:
   the first variable capacitor comprises:
     a first capacitor,
     a second capacitor, the first capacitor and the second capacitor being connected in parallel, and
     a switch connected in series with the second capacitor, and
   wherein the switch is configured to be turned-on and turned-off, thereby connecting the second capacitor to ground when the switch is turned-on and thereby adjusting the capacitance of the first variable capacitor.

7. The power amplifier module according to claim 1, further comprising:
   an output matching network disposed between an output terminal of the second amplifier and an input terminal of a subsequent circuit, the output matching network having an adjustable impedance transformation characteristic.

8. The power amplifier module according to claim 3, further comprising:
   an output matching network disposed between an output terminal of the second amplifier and an input terminal of a subsequent circuit, the output matching network having an adjustable impedance transformation characteristic.

9. The power amplifier module according to claim 4, further comprising:
   an output matching network disposed between an output terminal of the second amplifier and an input terminal of a subsequent circuit, the output matching network having an adjustable impedance transformation characteristic.

10. The power amplifier module according to claim 5, further comprising:
an output matching network disposed between an output terminal of the second amplifier and an input terminal of a subsequent circuit, the output matching network having an adjustable impedance transformation characteristic.

11. The power amplifier module according to claim 7, wherein:
the output matching network comprises a second variable capacitor or a second variable inductor, and
a capacitance of the second variable capacitor or an inductance of the second variable inductor is adjustable.

12. The power amplifier module according to claim 11, wherein the second variable capacitor or the second variable inductor is provided on the first chip.

13. The power amplifier module according to claim 1, further comprising:
a control circuit that outputs a control signal,
wherein the control circuit is provided on the first chip between the first amplifier and the switch circuit.

14. The power amplifier module according to claim 13, wherein the impedance transformation characteristic of the matching network is adjustable in accordance with the control signal.

15. The power amplifier module according to claim 5, further comprising:
a control circuit that outputs a control signal,
wherein the control circuit is provided on the first chip between the first amplifier and the switch circuit, and
wherein the switch is configured to be turned-on and turned-off based on the control signal.

16. The power amplifier module according to claim 7, further comprising:
a control circuit that outputs a control signal,
wherein the control circuit is provided on the first chip between the first amplifier and the switch circuit, and
wherein the impedance transformation characteristic of the output matching network is adjustable in accordance with the control signal.

17. A power amplifier module comprising:
a first amplifier that amplifies an input signal and outputs a first amplified signal;
a second amplifier that amplifies the first amplified signal and outputs a second amplified signal;
a matching network disposed between an output terminal of the first amplifier and an input terminal of the second amplifier, the matching network having an adjustable impedance transformation characteristic;
a switch circuit that is supplied with the second amplified signal and outputs the second amplified signal from one of a plurality of output terminals; and
a control circuit that outputs a control signal, wherein:
the first amplifier and the switch circuit are provided on a first chip,
the second amplifier is provided on a second chip, and
the control circuit is provided on the first chip between the first amplifier and the switch circuit.

18. The power amplifier module according to claim 17, wherein:
the first chip is a complementary metal-oxide semiconductor chip having a metal-oxide-semiconductor field-effect transistor, and
the second chip is a bipolar transistor chip having a bipolar transistor.

19. A power amplifier module comprising:
a first amplifier that amplifies an input signal and outputs a first amplified signal;
a second amplifier that amplifies the first amplified signal and outputs a second amplified signal;
a matching network disposed between an output terminal of the first amplifier and an input terminal of the second amplifier, the matching network having an adjustable impedance transformation characteristic;
a switch circuit that is supplied with the second amplified signal and outputs the second amplified signal from one of a plurality of output terminals; and
a control circuit that outputs a control signal, wherein:
the first amplifier and the switch circuit are provided on a first chip,
the second amplifier is provided on a second chip,
the control circuit is provided on the first chip between the first amplifier and the switch circuit, and
the impedance transformation characteristic of the matching network is adjustable in accordance with the control signal.

20. The power amplifier module according to claim 19, wherein:
the first chip is a complementary metal-oxide semiconductor chip having a metal-oxide-semiconductor field-effect transistor, and
the second chip is a bipolar transistor chip having a bipolar transistor.

* * * * *